United States Patent
Tailliet et al.

(10) Patent No.: US 7,620,868 B2
(45) Date of Patent: Nov. 17, 2009

(54) METHOD FOR DETECTING A MALFUNCTION IN A STATE MACHINE

(75) Inventors: Francois Tailliet, Fuveau (FR); Laurent Murillo, Marseilles (FR)

(73) Assignee: STMicroelectronics S.A., Montrouge (FR)

( * ) Notice: Subject to any disclaimer, the term of this patent is extended or adjusted under 35 U.S.C. 154(b) by 288 days.

(21) Appl. No.: 11/670,553

(22) Filed: Feb. 2, 2007

(65) Prior Publication Data
US 2007/0204191 A1 Aug. 30, 2007

(30) Foreign Application Priority Data
Feb. 3, 2006 (FR) .................................. 06 00974

(51) Int. Cl.
*G06F 11/00* (2006.01)
*G01R 31/28* (2006.01)
*G06F 7/38* (2006.01)

(52) U.S. Cl. .......................... 714/736; 714/21; 714/25; 326/46

(58) Field of Classification Search ................. 714/736, 714/21, 25; 326/46
See application file for complete search history.

(56) References Cited

U.S. PATENT DOCUMENTS 4,727,548 A 2/1988 Dickey ........................ 371/49

OTHER PUBLICATIONS

Zeng et al., Finite state machine synthesis with concurrent error detection, Sep. 28-30, 1999, IEEE, pp. 672-679.*
Leveugle, R. et al., "Alternative Approaches to Fault Detection in FSMs," International Workshop on Defect and Fault Tolerance in VLSI Systems, Montreal, Canada, Oct. 17-19, 1994, pp. 271-279.
Stojcev, M.K. et al., "VHDL-Based Design of FSM with Concurrent Error Detection Capability," Proc. 24th International Conference on Microelectronics, vol. 2, Nis, Serbia and Montenegro, May 16-19, 2004, pp. 759-762.

* cited by examiner

*Primary Examiner*—John J Tabone, Jr.
(74) *Attorney, Agent, or Firm*—Lisa K. Jorgenson; Robert Iannucci; Seed IP Law Group

(57) ABSTRACT

A method for detecting a malfunction in a state machine is described. The state machine has an operation modeled by a set of states linked to each other by transitions, the state machine generating, upon each transition, output signals according to input signals comprising signals generated during a previous transition. During a transition, the method comprises steps of generating at least one control signal according to a control signal generated during a previous transition, determining an expected value of the control signal, and comparing the control signal with the expected value.

22 Claims, 6 Drawing Sheets

METHOD FOR DETECTING A MALFUNCTION IN A STATE MACHINE

BACKGROUND OF THE INVENTION

1. Field of the Invention

The present invention relates to state machines, and in particular those used in integrated circuits.

2. Description of the Related Art

A state machine is a sort of automaton, the operation of which is modeled by a set of states linked to each other by transitions. A finite state machine comprises a finite number of states. The change from a state in progress to a next state linked to the state in progress by a transition is performed according to state variables.

Classically, a state machine comprises input signals and output signals generated upon each transition according to the input signals. The input and output signals of a state machine can also be listed as primary signals and secondary signals. The primary input signals are the signals that the state machine receives from the "external environment." The primary output signals are the signals the state machine sends to the external environment. The secondary output signals produced by the state machine become the secondary input signals upon the next transition. The secondary input signals inform the state machine about the state in progress.

Figure 1:
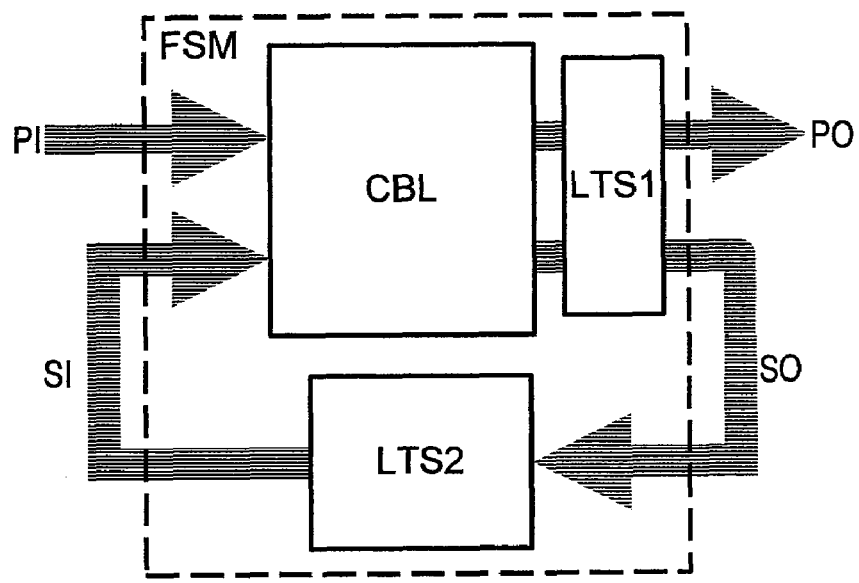

FIG. 1 represents a state machine in block form. In FIG. 1, the state machine FSM comprises a combinational logic circuit CBL and sets of latches LTS1, LTS2. All the outputs of the circuit CBL are connected to the set of latches LTS1. The circuit CBL comprises primary inputs PI and primary outputs PO. The circuit CBL also comprises secondary inputs SI and secondary outputs SO. The secondary outputs SO at output of the set LTS1 are connected to the set of latches LTS2. The latches in the set LTS1 enable the state in progress of the state machine to be stored, i.e., the last values of the primary and secondary output signals generated by the state machine. The secondary output signals, once locked by the set of latches LTS2, become the secondary input signals SI used by the circuit CBL to execute the next transition.

Many electronic circuits use state machines. This is particularly the case of certain serial access memories like EEPROM memories (Electrically Erasable Programmable Read-Only Memory).

In such applications, the transitions are generally performed in synchronization with a clock signal supplied by a communication bus. The primary input signals generally comprise signals received by the memory, and other signals internal to the memory. The primary output signals are control signals controlling various subsets of the memory (shift registers, memory array decoders, read circuitry, charge pump, etc.).

An excessively high clock frequency can seriously interfere with the operation of the state machine. This interference generally results in the production of incorrect output signals, which cause the state machine or the assembly into which the state machine is integrated to malfunction or crash. In the case of a memory, a malfunction can result, for example, in the decoding of incorrect commands, in the corruption of data read (thus reversible) or written (irreversible), or in the memory crashing, which can require a reset by cutting off and restoring the power supply.

The triggering of the malfunction can be involuntary (for example noise on the clock signal of an access bus, interpreted as a brief clock pulse), or voluntary. In the latter case, it may be attempts to interfere with the operation of a secure circuit, so as to try to violate a securization function. Indeed, certain EEPROM memories adapted to a specific application have securization functions, the operation of which can be more or less linked to the state machine.

To detect such a malfunction, one proposal already made consists in determining the frequency of the clock signal by measuring the duration of the periods or half-periods of the clock signal by means of a time reference and comparing the frequency thus determined with a frequency threshold. It transpires that this detection of malfunctioning is independent of the maximum operating frequency of the state machine. To be sure of being protected against a malfunction of the state machine, a frequency threshold is defined much lower than the actual malfunction threshold of the state machine. Indeed, depending on the variations in the supply voltage, temperature, and manufacturing parameters, the frequency of the time reference and the maximum operating frequency of the state machine vary in a decorrelated manner. An error signal must therefore be generated above a threshold much lower than the maximum operating frequency. The result is that the safety margin causes a reduction in the maximum operating frequency of the circuit. Typically, the threshold used to detect a malfunction is set to a frequency at least two times lower than the maximum operating frequency of the state machine.

BRIEF SUMMARY OF THE INVENTION

The methods and systems disclosed reduce this safety margin to a minimum value. The disclosed methods and systems also precisely detect a risk of malfunction of the state machine, linked to an anomaly on the clock signal.

One embodiment detects malfunction conditions directly from the operation of the state machine.

More particularly, one embodiment provides a method for detecting a malfunction in a state machine having an operation modeled by a set of states linked to each other by transitions, the state machine generating, upon each transition, output signals according to input signals comprising signals generated during a previous transition.

According to one embodiment, the method comprises:
  defining in the state machine a processing circuit for generating at least one control signal according to a control signal generated during a previous transition,
  generating during a transition the control signal according to a control signal generated during a previous transition,
  determining during the transition an expected value of each control signal, and
  comparing each control signal generated with the expected value.

According to one embodiment, the method comprises generating two logic control signals that are the opposite of one another and inverted upon each transition of the state machine.

According to one embodiment, the logic control signals D1, D2 are obtained by the following logic operations:

$$D1=N[C1].C2,$$

$$D2=C1.N[C2]$$

in which C1 and C2 are the logic control signals obtained during a previous transition, N[x] represents the logic inversion operation applied to the signal x, and "." represents the AND logic operation.

According to one embodiment, the method comprises generating an error signal according to the result of the comparison step.

The methods and systems disclosed also relate to a device for detecting a malfunction in a state machine having an operation modeled by a set of states linked to each other by transitions, the state machine generating, upon each transition, output signals according to input signals comprising signals generated during a previous transition.

According to one embodiment, the device comprises:

a control signal generating circuit in the state machine, for generating at least one control signal during a transition of the state machine, according to a control signal generated by the state machine during a previous transition, and a checking circuit for determining an expected value of each control signal, and comparing the control signal with the expected value.

According to one embodiment, the control signal generating circuit generates two logic control signals that are the opposite of one another and inverted upon each transition of the state machine.

According to one embodiment, the control signal generating circuit implements the following logic operations:

$$D1=N[C1].C2,$$

$$D2=C1.N[C2]$$

in which D1 and D2 are the logic control signals generated during a transition in progress, C1 and C2 are the logic control signals obtained during a previous transition, N[x] represents the logic inversion operation applied to the signal x, and "." represents the AND logic operation.

According to one embodiment, the checking circuit generates an error signal according to the comparison of the control signal with the expected value.

According to one embodiment, the state machine comprises a programmable logic array comprising input inverters, product logic circuits, sum logic circuits, and configuration means for selectively connecting inputs of the state machine and outputs of the input inverters to product logic circuits, and for selectively connecting outputs of the product logic circuits to inputs of sum logic circuits, the control signal generating circuit comprising, for each logic control signal to be generated, a product logic circuit connected to a sum logic circuit supplying the logic control signal.

According to one embodiment, the product logic circuits and the sum logic circuits supplying the logic control signals are configured so that the generation of the logic control signals is slowed down.

The methods and systems disclosed also relate to a state machine having an operation modeled by a set of states linked to each other by transitions, and generating, upon each transition, output signals according to input signals comprising signals generated during a previous transition.

According to one embodiment, the state machine comprises a control signal generating circuit for generating at least one control signal during a transition of the state machine, according to a control signal generated during a previous transition, and a checking circuit for determining an expected value of the control signal and comparing the control signal with the expected value.

According to one embodiment, the control signal generating circuit generates two logic control signals that are the opposite of one another and inverted upon each transition of the state machine.

According to one embodiment, the control signal generating circuit implements the following logic operations:

$$D1=N[C1].C2,$$

$$D2=C1.N[C2]$$

in which C1 and C2 are the logic control signals obtained during a previous transition, N[x] represents the logic inversion operation applied to the signal x, and "." represents the AND logic operation.

According to one embodiment, the state machine comprises a programmable logic array comprising input inverters, product logic circuits, sum logic circuits, and configuration means for selectively connecting inputs of the state machine and outputs of the input inverters to product logic circuits, and for selectively connecting outputs of the product logic circuits to inputs of sum logic circuits, the control signal generating circuit comprising for each logic control signal a product logic circuit connected to a sum logic circuit supplying the logic control signal.

According to one embodiment, the product logic circuits and the sum logic circuits supplying the logic control signals are configured so that the generation of the logic control signals is slowed down.

BRIEF DESCRIPTION OF THE SEVERAL VIEWS OF THE DRAWING(S)

Figure 2:
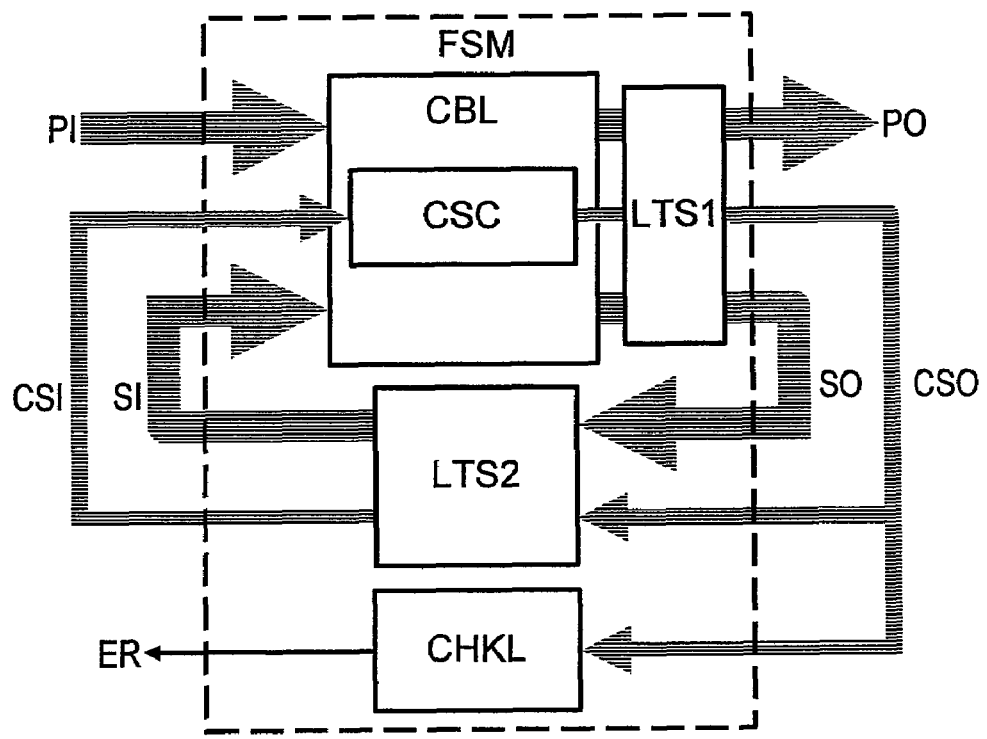
Figure 3:
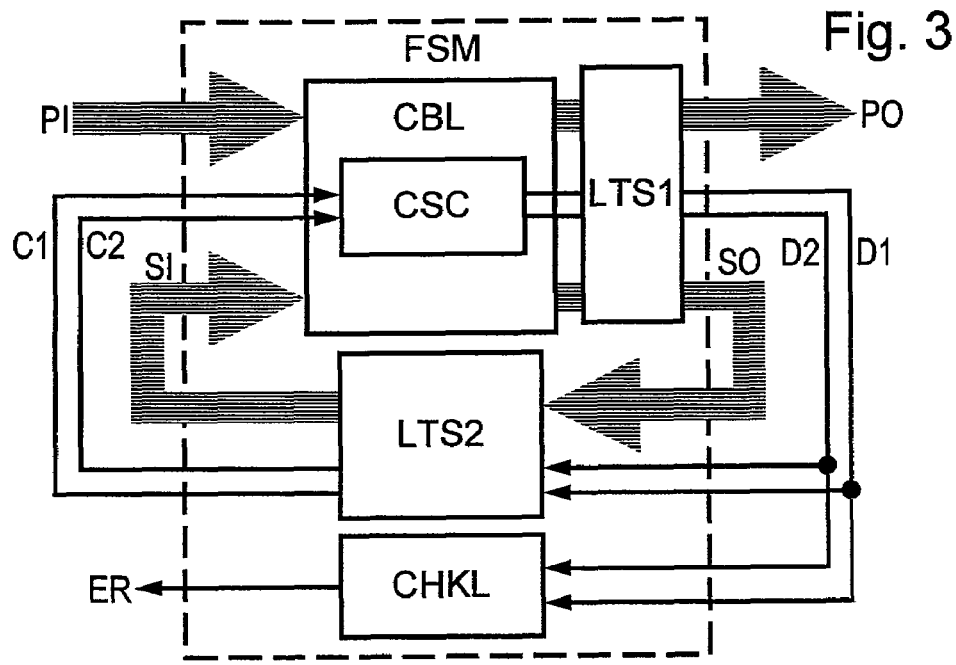
Figure 4:
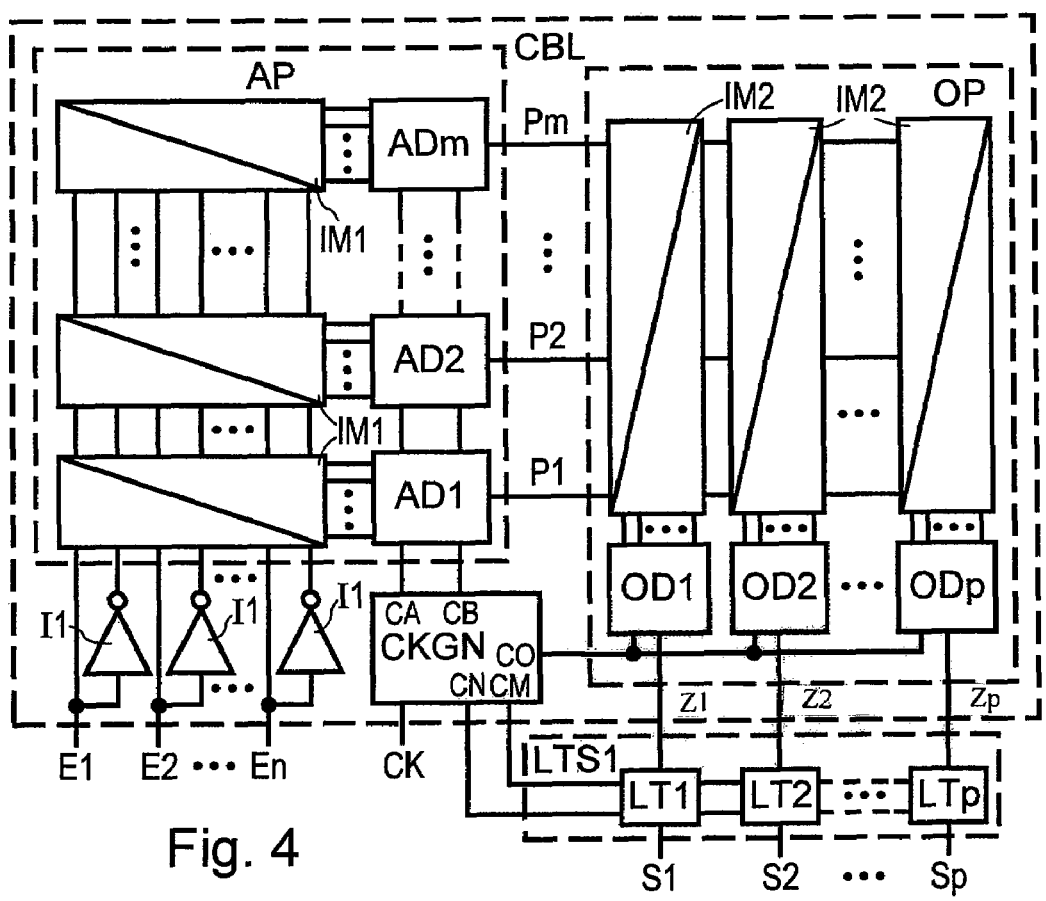
Figure 7:
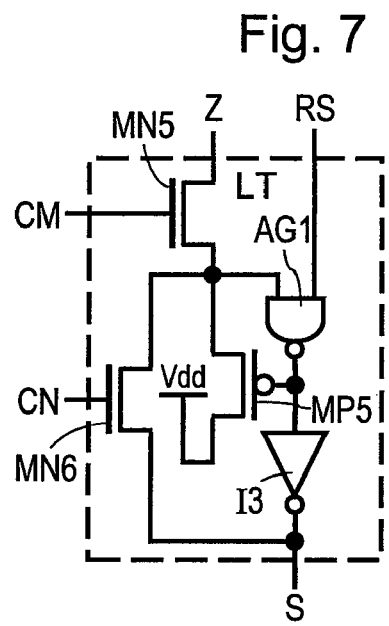
Figure 8:
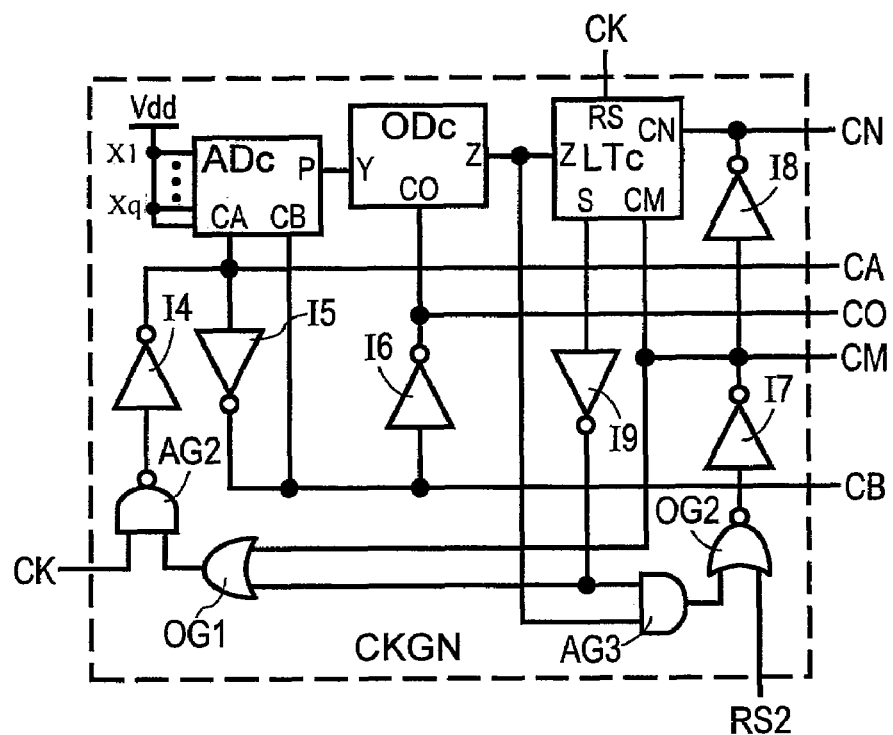
Figure 9:
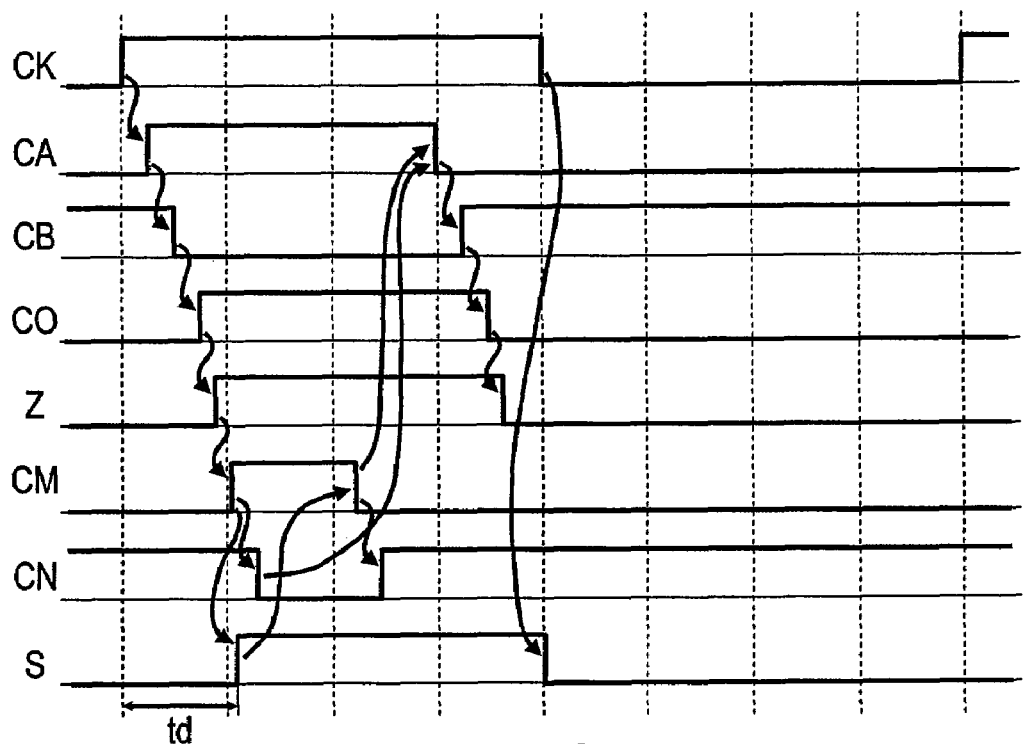
Figure 10:
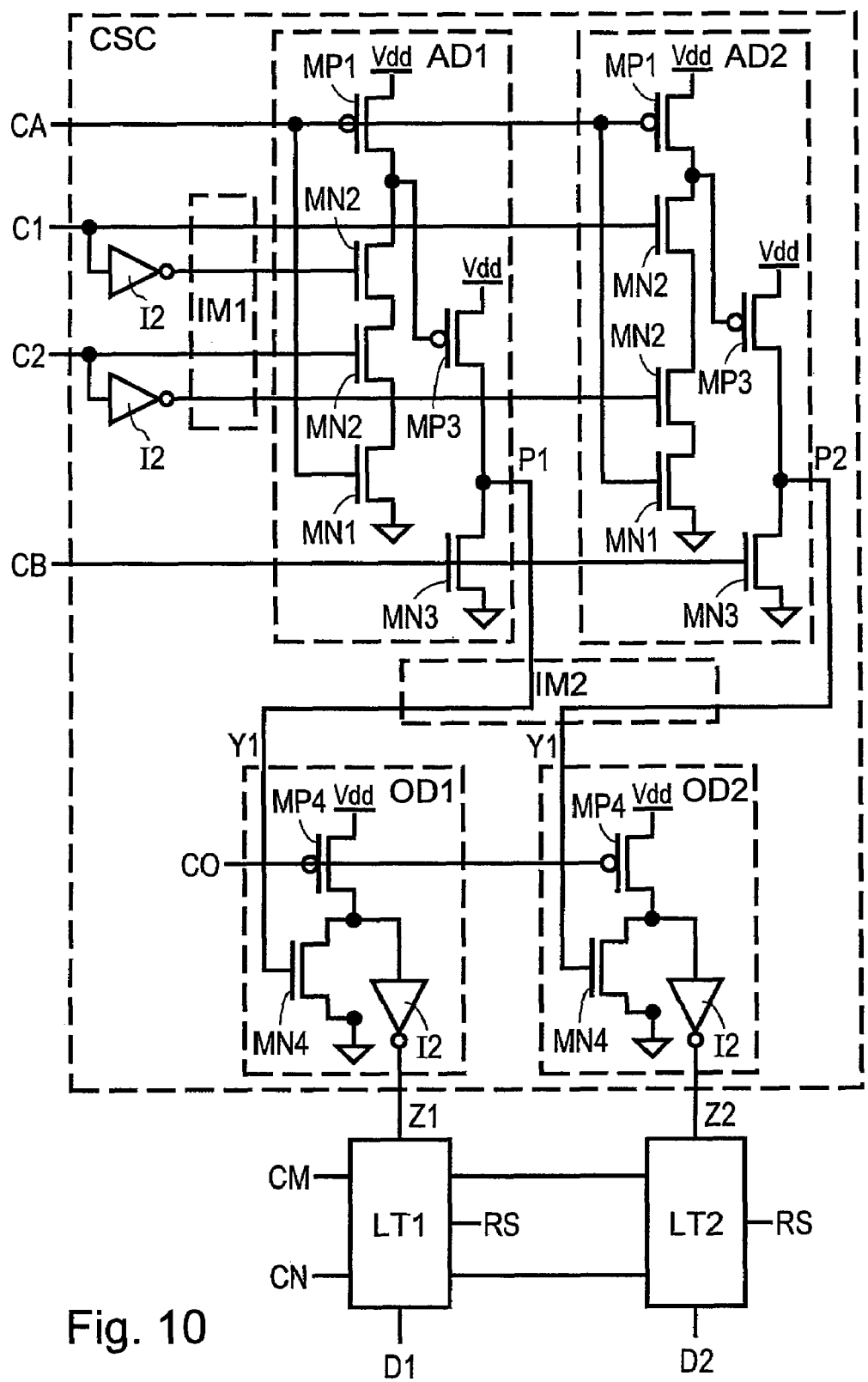
Figure 11:
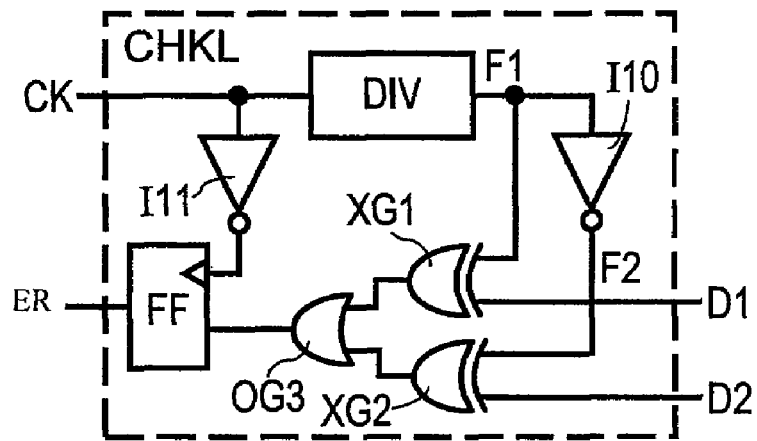
Figure 12:
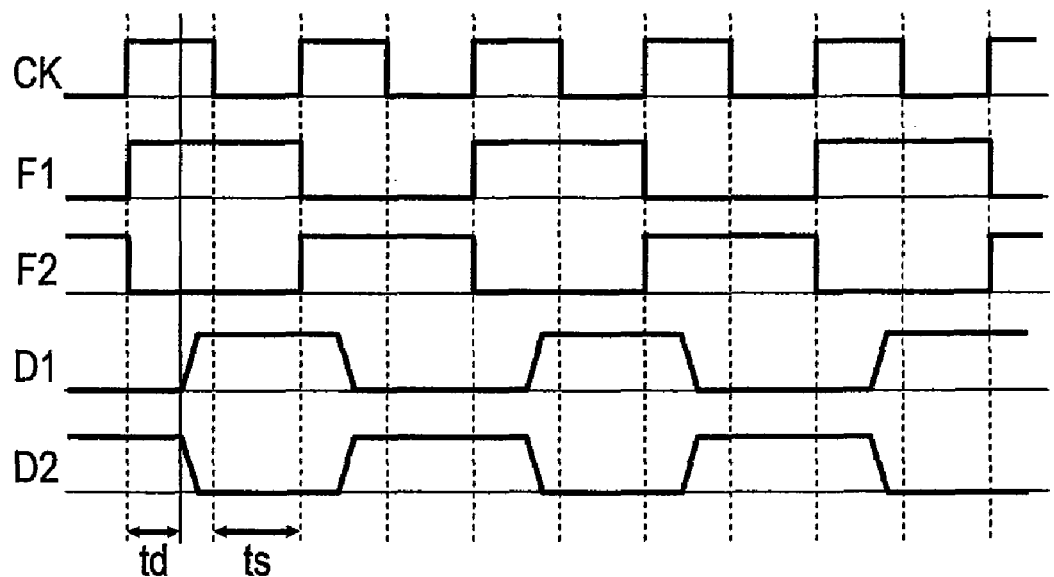

These and other objects, features and advantages of the present invention shall be presented in greater detail in the following description of one embodiment, given in relation with, but not limited to the following figures, in which:

FIG. 1, already described, represents in block form a state machine according to previous practices, FIG. 2 represents in block form a state machine, according to one embodiment, FIG. 3 represents in block form a state machine, according to one embodiment, FIG. 4 represents in block form a combinational logic circuit of the state machine shown in FIG. 3, according to one embodiment, FIGS. 5 to 8 are electrical circuits of blocks of the combinational logic circuit represented in FIG. 4, according to one embodiment, FIG. 9 shows in the form of timing diagrams the operation of the circuit represented in FIG. 8, according to one embodiment, FIG. 10 is a wiring diagram of a secondary control signal generating circuit, of the combinational logic circuit, according to one embodiment, FIG. 11 is a wiring diagram of an error detector circuit of the state machine represented in FIG. 3, according to one embodiment, FIG. 12 shows in the form of timing diagrams the operation of the error detector circuit represented in FIG. 11, according to one embodiment.

DETAILED DESCRIPTION OF THE INVENTION

FIG. 2 represents a state machine according to one embodiment. In FIG. 2, the state machine FSM comprises a combinational logic circuit CBL and sets of latches LTS1, LTS2. All the outputs of the circuit CBL are connected to the set of latches LTS1. The circuit CBL comprises primary inputs PI and primary outputs PO. The circuit CBL also comprises secondary inputs SI and secondary outputs SO. The secondary outputs SO at output of the set LTS1 are connected to the set of latches LTS2. The latches of the set LTS1 enable the states of the state machine to be stored, i.e., the values of the primary and secondary output signals generated by the state machine. The secondary output signals SO, once locked by the set of latches LTS2, become the secondary input signals SI used by the circuit CBL to perform the next transition.

According to one embodiment, the circuit CBL comprises a control circuit CSC supplying secondary output control signals CSO that are applied to the set of latches LTS1, and then to the set of latches LTS2. Once locked by the set LTS2, the signals CSO become secondary input control signals CSI that are applied at input of the circuit CSC.

The state machine FSM according to one embodiment also comprises a checking circuit CHKL that receives the secondary output control signals CSO, and that generates an error signal ER according to the value of each of the signals CSO. The error signal is for example generated by comparing the signals CSO with expected values.

When the signal ER indicates that an error has been detected, several actions can be carried out depending on the application of the state machine FSM. Thus, the signal ER can be used to reset all or part of the component into which the state machine is integrated. The signal ER can also be supplied outside the component to indicate the error to units external to the component.

FIG. 3 represents one specific embodiment of the state machine FSM shown in FIG. 2. In FIG. 3, the secondary output control signals CSO supplied by the control circuit CSC, at output of the set of latches LTS1, comprise two signals D1, D2 that become signals C1, C2 at output of the latches LTS2.

FIG. 4 represents one embodiment of the combinational logic circuit CBL. In FIG. 4, the circuit CBL receives input signals E1, E2, ... En and supplies output signals S1, S2, ... Sp resulting from the application of logic functions to the signals E1, E2, ... En. The circuit CBL is produced using a programmable logic array PLA that receives the input signals E1-En, and that supplies the output signals S1-Sp. The signals S1-Sp are, in a determined manner, the sum of products of the signals E1-En.

Classically, the programmable logic array of the circuit CBL comprises an input stage AP, also referred to as "AND array" applying the AND or product logic function to the input signals E1-En, and an output stage OP, also referred to as "OR array" applying the OR or sum function to the output signals P1, P2, ... Pm of the stage AP.

The programmable logic array comprises inverters 11 receiving the input signals E1-En and the outputs of which are connected to inputs of the input stage AP. The outputs Z1-Zp of the programmable logic array made up of the outputs of the output stage OP are connected to output latches LT1, LT2, ... LTp of the set LTS1, which each save an output signal S1-Sp of the circuit CBL. The programmable logic array comprises a clock signal generating circuit CKGN pacing the input AP and output OP stages, and the latches LT1-LTp.

The input stage AP of the circuit CBL comprises several product logic circuits AD1, AD2, ... ADm, each performing an AND logic function, with several inputs and one output P1, P2, ... Pm, and interconnection matrices IM1 each selectively connecting certain inputs of the input stage AP grouping together the inputs E1-En of the circuit CBL and the inverted inputs thereof to certain inputs of one of the product logic circuits AD1-ADm. Thus, if the circuit CBL comprises n inputs E1-En, and if each circuit AD1-ADm comprises q inputs at the most, each interconnection matrix IM1 comprises $2n$ inputs and q outputs. Generally, the number q of inputs of each product circuit is at the most equal to the number n of inputs of the programmable logic array. The outputs P1-Pm of the circuits AD1-ADm form the outputs of the input stage AP.

The output stage OP of the circuit CBL comprises several sum logic circuits OD1, OD2, ... ODp, each performing an OR or sum function, with several inputs and one output, and interconnection matrices IM2 each selectively connecting certain outputs P1-Pm of the input stage AP to certain inputs of one of the product logic circuits OD1-ODp. If the circuit CBL comprises m circuits AD1-ADm, and if each sum logic circuit OD1-ODp comprises r inputs at the most, each interconnection matrix IM2 comprises m inputs and r outputs. Generally speaking, the number r of inputs of the sum circuits is lower than the number m of the outputs of input stage AP. The outputs of the circuits OD1-ODp, Z1-Zp, form the outputs of the output stage OP and are each connected to the input of a latch LT1-LTp.

The configuration of the interconnection matrices IM1, IM2 determines the logic function performed by the circuit CBL.

In the following description, the references starting with "MN" are used to designate an N-channel MOS transistor and the references starting with "MP" are used to designate a P-channel MOS transistor.

Figure 5:
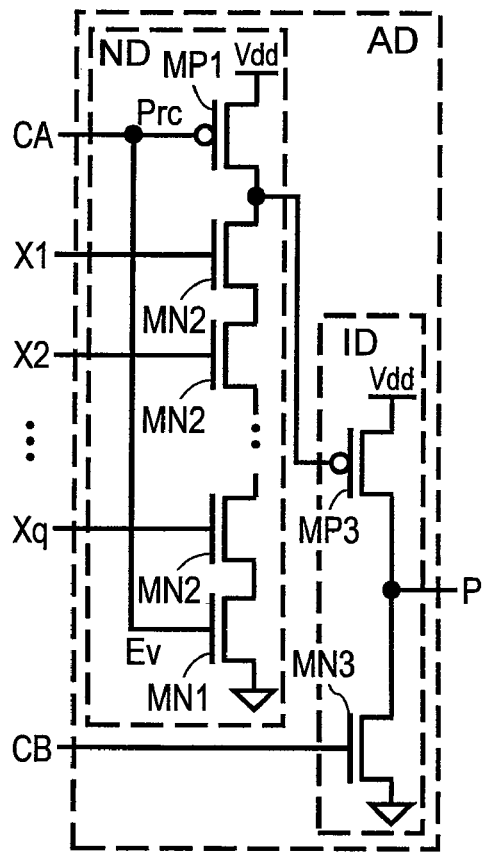

FIG. 5 is a wiring diagram of a product logic circuit AD of the input stage AP. In FIG. 5, the circuit AD comprises an input branch ND performing a dynamic inverted AND logic function, and an output branch ID performing the function of a dynamic inverter, the output of which forms an output P of the circuit AD.

The input branch ND of the circuit AD comprises a group of several transistors MN2 arranged in series. The gate of each transistor MN2 is connected to an input X1-Xq of the circuit AD. The group of transistors MN2 comprises a first transistor MN2, the gate of which is connected to a first input X1 of the circuit AD, and the drain of which is connected to the drain of a transistor MP1. The gate of the transistor MP1 receives a clock signal CA, and the source of this transistor receives a supply voltage Vdd. The transistor MP1 precharges the transistors MN2. The group of transistors MN2 comprises a last transistor MN2, the gate of which is connected to a last input Xq of the circuit AD, and the source of which is connected to the drain of a transistor MN1. The gate of the transistor MN1 receives the clock signal CA, and the source of this transistor is connected to the ground. The connection node of the drain of the transistor MP1 to the drain of the first transistor MN2 forms the output of the dynamic inverted AND logic function. The transistor MN1 enables the dynamic inverted AND logic function performed by the transistors MN2 to be evaluated, further to the precharge thereof. The clock signal CA determines precharge (CA=0) and evaluation (CA=1) phases of the input branch ND of the circuit AD.

The output branch ID of the circuit AD comprises a transistor MP3, the gate of which is connected to the output of the input branch ND, i.e., to the drain of the transistor MP1 and to the drain of the first transistor MN2. The source of the transistor MP3 receives the supply voltage Vdd. The output branch ID comprises a transistor MN3, the gate of which receives a clock signal CB, the source of which is grounded and the drain of which is connected to the drain of the transistor MP3 and to the output P of the circuit AD.

The transistor MN3 enables the precharge, and then the dynamic inversion logic function performed by the transistor MP3 to be evaluated. The clock signal CB determines precharge (CB=1) and evaluation (CB=0) phases of the output branch ID of the circuit AD.

Figure 6:
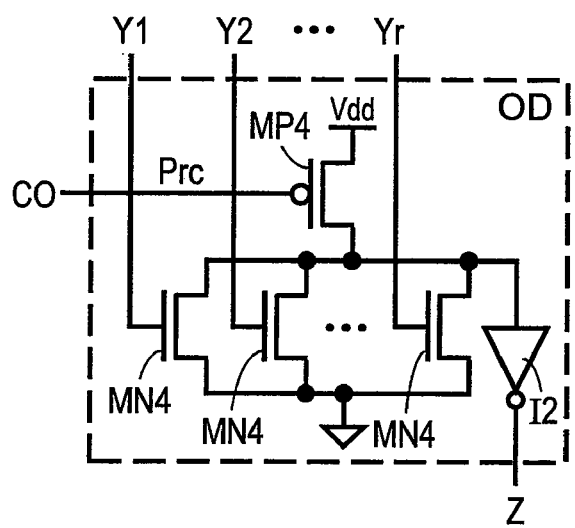

FIG. 6 is the wiring diagram of a sum logic circuit OD of the output stage OP. In FIG. 6, the circuit OD comprises several transistors MN4 arranged in parallel, the source of which is connected to the ground. The gate of each of the transistors MN4 is connected to an input Y1-Yr of the circuit OD. The drain of the transistors MN4 is connected to the drain of a transistor MP4, the source of which receives the supply voltage Vdd, and the gate of which receives a clock signal CO. The transistors MN4 perform a dynamic inverted OR function, the drain of each of the transistors MN4 constituting the output of the function and being connected to the input of an inverter 12. The output of the inverter 12 supplies the output signal Z of the circuit OD.

The transistor MP4 enables the dynamic inverted OR logic function performed by the transistors MN4 to be evaluated, further to the precharge thereof. The clock signal CO controlling the transistor MP4 determines precharge (CO=0) and evaluation (CO=1) phases of the circuit OD.

FIG. 7 is the wiring diagram of a latch LT identical to the latches LT1-LTp in the set of latches LTS1. The latch LT comprises a transistor MN5, the drain of which receives the output signal Z of a product logic circuit OD, and the gate of which receives a clock signal CM. The source of the transistor MN5 is connected to the input of an inverted AND-type logic gate AG1, to the source of a transistor MN6, the gate of which receives a clock signal CN, and to the drain of a transistor MP5, the source of which receives the supply voltage Vdd. Another input of the gate AG1 receives an initialization signal RS. The output of the gate AG1 is connected to the gate of the transistor MP5, and to the input of an inverter 13, the output of which forms an output S of the latch LT and is connected to the drain of the transistor MN6.

The clock signals CM and CN determine charge (CM=1, CN=0) and lock (CM=0, CN=1) phases of the latch LT. The latch LT in the locked state (signals CM and CN respectively on 0 and 1) can be initialized to 0 by putting the initialization signal RS to 0. The transistor MP5 prevents an overconsumption of the latch from occurring by avoiding leakages. Indeed, when the transistor MN5 is on, it does not allow the voltage Vdd to pass on the input of the gate AG1, but Vdd-VtN (VtN being the threshold voltage of the N-channel MOS transistors). The voltage Vdd-VtN is sufficient to cause the gate AG1 to switch, but the P-channel MOS transistor at the input of the gate AG1 connected to the transistor MN5 might leak. The presence of the transistor MP5 enables the voltage at the input of the gate AG1 to be stepped up to Vdd, if the latter has switched.

FIG. 8 is a wiring diagram of the clock signal generating circuit CKGN of the circuit CBL. The circuit CKGN uses a product logic circuit ADc, a sum logic circuit ODc and a latch LTc of the programmable logic array forming the circuit CBL. The output P of the circuit ADc is connected to the input Y of the circuit ODc. The output Z of the circuit ODc is connected to the input Z of the latch LTc. The initialization input of the latch LTc receives, as initialization signal, the clock signal CK. All the inputs X1-Xq of the circuit ADc are connected to the supply voltage source Vdd.

The circuit CKGN comprises an inverted AND-type logic gate AG2 receiving a primary clock signal CK. The output of the gate AG2 is connected to the input of an inverter 14, the output of which supplies the clock signal CA that is applied to the product circuits ADc, AD1-ADm of the input stage AP, including the product circuit ADc of the circuit CKGN.

The circuit CKGN comprises an inverter 15 receiving the clock signal CA and supplying the clock signal CB also applied to the product circuits AD1-ADm and ADc. The circuit CKGN comprises an inverter 16 receiving the clock signal CB and supplying the clock signal CO applied to the sum circuits ODc, OD1-ODp of the output stage OP, including the sum circuit ODc of the circuit CKGN.

The circuit CKGN comprises an AND-type logic gate AG3, one input of which is connected to the output Z of the circuit ODc and the output of which is connected to the input of an inverted OR-type logic gate OG2. Another input of the gate OG2 receives an initialization signal RS2 and the output of this gate is connected to the input of an inverter 17, the output of which supplies the clock signal CM that is applied to the latch LTc and to an input of an OR-type logic gate OG1.

The circuit CKGN comprises an inverter 18 receiving the clock signal CM and supplying the clock signal CN applied to the latches LTc and LT1-LTp. The output S of the latch LTc is connected to the input of an inverter 19, the output of which is connected to an input of the gate AG3 and to an input of the gate OG1.

FIG. 9 shows in the form of timing diagrams the operation of the clock signal generating circuit CKGN. FIG. 9 represents the timing diagrams of the clock signals CK, CA, CB, CO, CM and CN, of the output signal Z of the circuit ODc and of the output signal S of the latch LTc of the circuit CKGN. In an initial state, the clock signals CA, CO, and CM, the output signal Z of the circuit ODc and the output signal S of the latch LTc are equal to 0, whereas the clock signals CB and CN are equal to 1. The result is that the precharge of the input stage AP and of the output stage OP starts.

Upon the arrival of a rising edge of the primary clock signal CK, in the initial state of the circuit CKGN, the clock signal CA changes to 1, marking the end of the precharge of the input stage AP and thus the start of the evaluation of the input branches ND of the input stage. At the end of the precharge of the input stage AP, the clock signal CB at output of the inverter 15 then changes to 0. The outputs P1-Pm of the input stage AP are then valid. In fact, the outputs P1, Pm are only valid for a certain amount of time after the start of the evaluation of the input stage due to the propagation time of the input signals E1-En in the input branches ND. To be sure that this propagation time is over, and therefore that the outputs P1-Pm of the input stage AD are valid, the circuit ADc of the circuit CKGN comprises a greater number of inputs than the number n of inputs E1-En of the circuit CBL, i.e., than the number q of inputs of each circuit AD1-ADp. The circuit ADc is thus the slowest of all the product circuits AD1-ADm, ADc of the circuit CBL to supply a valid output signal P.

When the output of the circuit ADc switches, the signal CO changes to 1, and the precharge of the output stage OP is stopped. The output signal P of the product circuit ADc of the circuit CKGN then changes to 1. To determine when the outputs of the output stage OP are valid, the output P of the circuit ADc is applied to an input of the sum circuit ODc of the circuit CKGN. The number of inputs of the circuit ODc is chosen to be greater than the total number of circuits ADc, AD1-ADp used, one input Y of the circuit ODc being connected to the output P of the circuit ADc and all the other inputs of the circuit ODc being grounded. Thus, when the output Z of the circuit ODc switches, it is sure that all the outputs Z1-Zp of the circuits OD1-ODp have had time to switch. After a certain period of time required for the propagation of the signals in the output stage OP, the outputs Z of the sum circuits ODc, OD1-ODp switch.

The two inputs of the gate AG3 are then on 1. The result is that the clock signal CM changes to 1. The change to 1 of the clock signal CM causes the clock signal CN to change to 0 through the inverter 18 and causes a state change of the output S of the latch LT of the circuit CKGN that changes to 1. The state change of the output S of the latch LT causes the clock signal CM to change to 0, then the clock signal CN to change to 1. The output signals Z, Z1-Zp of the circuits ODc, OD1-ODp are thus locked by the latches LTc, LT1-LTp as soon as they are valid. The signal CA then changes to 0 through the gates OG1, AG2 and the inverter 14. The change to 0 of the signal CA causes the signal CB to change to 1, and then the signal CO to change to 0, and finally the output signal Z of the circuit ODc to change to 0. The evaluation phase of the input AP and output OP stages is therefore stopped, to restart a new precharge phase of the input AP and output OP stages. Upon the falling edge of the primary clock signal CK that initializes the latch LTc, the output signal S of this latch changes back to 0.

During the new precharge phase, the input signals E1-En take a new value corresponding to a new input state of the state machine FSM. Then, the process previously described restarts to execute a new transition of the state machine.

It shall be noted that for the state machine to operate correctly, all the inputs E1-En should be stable a little before the rising of the clock signal CK, until at least the falling of the clock signal CM.

In FIG. 9, it appears that the last event before the arrival of the falling edge of the primary clock signal CK is the change to 0 of the clock signal CO. If the falling edge of the signal CK appears before the signal CO falls back, due to a fortuitous or voluntary interference, the operation of the circuit CKGN will be interfered with and will generate clock signals CA, CB, CO, CM, CN which do not enable the product circuits AD, the sum circuits OD and the latches LT of the circuit CBL to be correctly synchronized. The circuit CBL will therefore generate incorrect signals.

By adding the secondary control signals C1, C2, D1, D2, the values of which are predictable, the methods and systems disclosed detect such an incorrect operation of the circuit CBL.

Advantageously, the interconnection matrices IM1 and IM2 are configured to generate the secondary output control signals D1, D2 by applying the following logic operations to the secondary input control signals C1, C2:

$$D1=N[C1].C2, \quad (1)$$

$$D2=C1.N[C2] \quad (2)$$

in which N[x] represents the logic inversion operation (NOT) applied to the signal x, and "." represents the AND logic operation.

Thus, the signals D1 and D2 enable incorrect changes to 0 and to 1 of signals internal to the circuit CBL to be detected.

According to one embodiment shown in FIG. 10, the control circuit CSC is produced using two product circuits AD1, AD2 and two sum circuits OD1, OD2 of the circuit CBL, to generate the signals D1, D2 according to the signals C1, C2, in accordance with the logic operations (1) and (2). The transistors MN2, MN4, the gate of which is not connected, have not been represented in FIG. 10.

To perform the logic operation (1), an interconnection matrix IM1 is configured for applying the signal C1 previously inverted by an inverter I2, and the signal C2 to inputs of the first product circuit AD1. The other inputs of the circuit AD1 are not connected. An interconnection matrix IM2 is configured for connecting the output P1 of the circuit AD1 to one input Y1 of the first sum circuit OD1, the other inputs of which are not connected.

Similarly, to perform the logic operation (2), an interconnection matrix IM1 is configured for applying the signal C1 and the signal C2 previously inverted by an inverter I2 to inputs of the second product circuit AD2. The other inputs of the circuit AD2 are not connected. An interconnection matrix IM2 is configured for connecting the output P2 of the circuit AD2 to one input Y1 of the second sum circuit OD2, the other inputs of which are not connected.

The latches LT1, LT2 connected to the outputs Z1, Z2 of the sum circuits OD1, OD2 are respectively initialized to 0 and 1 or conversely. The result is that the signals D1 and D2 at output of the latches LT1, LT2 change state upon each transition of the state machine FSM and always have different values.

The latch LT2 supplying the signal D2 is different from the other latches of the set LTS1 to be able to be initialized to 1. For this purpose, the gate AG1 of the latch LT represented in FIG. 7 is replaced by an inverted OR gate one input of which can receive an initialize-to-1 control signal.

For the generation of the signals P1 and P2, the product circuits AD1, AD2 advantageously have several additional transistors MN2, the gate of which is connected to the supply voltage source Vdd. Preferably, the total number of transistors MN2 of each of the circuits AD1, AD2 is equal to the maximum number q of transistors found in a product circuit out of all the product circuits AD1-ADm of the circuit CBL.

Similarly, for the generation of the output signals Z1 and Z2, the sum circuits OD1, OD2 advantageously have several additional transistors MN4, the gate of which is connected to the ground. Preferably, the total number of transistors MN4 of each of the circuits OD1, OD2 is equal to the maximum number r of transistors MN4 found in a sum circuit out of all the sum circuits OD1-ODp of the circuit CBL.

Thus, the generation of the signals D1 and D2 is slowed down as much as possible. The result is that a risk of malfunction is detected in a more sensitive manner.

FIG. 11 is a wiring diagram of the checking circuit CHKL. The circuit CHKL comprises a frequency divider by 2 DIV receiving the primary clock signal CK at input and supplying a control signal F1, the frequency of which is equal to half the frequency of the signal CK. The divider DIV is for example produced using a single-stage counter. The control signal F1 is applied to the input of an inverter 110 and to an input of an EXCLUSIVE OR-type logic gate XG1, another input of which receives the secondary output control signal D1. The output of the inverter 110 supplies a second control signal F2 that is applied to an input of an EXCLUSIVE OR-type logic gate XG2, another input of which receives the secondary output control signal D2. The output of each gate XG1, XG2 is connected to an input of an OR-type logic gate OG3, the output of which is connected to the input of a D-type flip-flop FF, i.e., triggered upon edges of the clock signal.

The circuit CHKL comprises an inverter 111 receiving the primary clock signal CK at input and the output of which is connected to a clock signal input of the flip-flop FF. The output of the flip-flop FF supplies the output signal ER of the circuit CHKL. From the logic point of view, the flip-flop FF performs a function equivalent to an AND logic gate.

The circuit CHKL performs the following logic function:

$$ER=(D1 \oplus F1+D2 \oplus F2).N[CK] \quad (3)$$

in which "$\oplus$" represents the EXCLUSIVE OR logic operation, and "+" represents the OR logic operation. In other words, the signal ER changes to 1 to indicate that an error has been detected (ER=1) if the signals D1 and F1 are different or the signals D2 and F2 are different when the clock signal CK is on 0.

The operation of the circuit CHKL is shown by the timing diagrams represented in FIG. 12. FIG. 12 represents the timing diagrams of the primary clock signals CK and of the control signals F1, F2, D1 and D2.

The signals F1 at output of the divider DIV and F2 at output of the inverter 110 change state upon each rising edge of the clock signal CK and are in opposite phase. The signals D1 and D2 have the same frequency as the signals F1 and F2 and are also in opposite phase. The signals F1 and D1 are phase-shifted by a duration td. The same applies to the signals F2 and D2. The duration td corresponds to the time of the decoding performed by the circuit CBL, i.e., to the time between the change to 1 of the clock signal CK and the change to 1 of the signal S at output of the latch LTc. Due to the presence of the flip-flop FF, the periods ts during which the clock signal CK is on 0 define the periods during which the output signal ER of the circuit CHKL may be evaluated, i.e., can change to 1 due to a difference detected between the signals D1 and/or D2 and the signals F1 and/or F2.

It will be understood that various alternative embodiments and applications of the present invention are possible. Thus, the present invention is not limited to state machines produced using a programmable logic array. For a malfunction of the state machine to be detected, it is merely important that the control signals be generated by the state machine.

It is not necessary for the control signals to be generated upon each transition of the state machine. Thus, the control signals can be generated only during certain critical phases of processing performed by the state machine.

The number of control signals generated upon each transition is not necessarily equal to 2. Only one or more than two control signals can be generated to detect a malfunction of a state machine. The use of two control signals of opposite values that change state upon each transition merely optimizes the number of types of errors detected and the number of additional signals provided to control the operation of the state machine.

The present invention does not apply solely to EEPROM memories. It can be applied to any device comprising a state machine.

The invention claimed is:

1. A method, comprising:
   detecting a malfunction in a state machine having an operation modeled by a set of states linked to each other by transitions, the state machine generating, upon each transition, output signals according to input signals, the input signals comprising signals generated during a previous transition, by:
   generating, using a processing circuit of the state machine, during a current transition at least one control signal according to a control signal generated during a previous transition;
   determining during the current transition an expected value of the at least one control signal; and
   comparing the at least one control signal generated with the expected value.

2. The method according to claim 1, wherein the generating the at least one control signal further includes:
   generating two logic control signals that are opposites of one another and are inverted upon each transition of the state machine.

3. The method according to claim 2, wherein the two logic control signals are each generated according to a respective logic control signal obtained during a previous transition, and wherein the two logic control signals are obtained by the following logic operations:

$D1 = N[C1].C2,$ $D2 = C1.N[C2]$ in which D1 corresponds to one of the two logic control signals and D2 corresponds to the other of the two logic control signals, C1 and C2 are the respective logic control signals obtained during a previous transition, N[x] represents a logic inversion operation applied to a signal x, and "." represents an AND logic operation.

4. The method according to claim 1, further comprising:
   generating an error signal according to a result of the comparing.

5. The method according to claim 1, wherein the determining the expected value of the at least one control signal includes deriving the expected value from a clock signal frequency.

6. A device for detecting a malfunction in a state machine, the device comprising:
   a state machine having an operation modeled by a set of states linked to each other by transitions, the state machine generating, upon each transition, output signals according to input signals, the input signals comprising signals generated during a previous transition;
   a control signal generating circuit in the state machine, for generating at least one control signal during a transition of the state machine, according to a control signal generated by the control signal generating circuit during a previous transition; and
   a checking circuit for determining an expected value of the at least one control signal, and comparing the at least one control signal with the expected value.

7. The device according to claim 6, wherein the control signal generating circuit generates two logic control signals that are the opposite of one another and inverted upon each transition of the state machine.

8. The device according to claim 7, wherein the control signal generating circuit implements the following logic operations:

$D1 = N[C1].C2,$ $D2 = C1.N[C2]$ in which D1 and D2 are each a distinct one of the two logic control signals generated during a transition in progress, C1 and C2 are logic control signals obtained during a previous transition, N[x] represents a logic inversion operation applied to a signal x, and "." represents an AND logic operation.

9. The device according to claim 7, wherein the state machine comprises a programmable logic array comprising input inverters, product logic circuits, sum logic circuits, and configuration means for selectively connecting inputs of the state machine and outputs of the input inverters to the product logic circuits, and for selectively connecting outputs of the product logic circuits to inputs of the sum logic circuits, the control signal generating circuit comprising, for each of the two logic control signals to be generated, a product logic circuit connected to a sum logic circuit supplying the logic control signal.

10. The device according to claim 9, wherein the product logic circuits and the sum logic circuits supplying the logic control signals are configured so that the generation of the logic control signals is slowed down.

11. The device according to claim 6, wherein the checking circuit generates an error signal according to the comparison of the at least one control signal with the expected value.

12. The device according to claim 6, wherein the expected value of the at least one control signal is derived from a clock signal frequency.

13. A state machine having an operation modeled by a set of states linked to each other by transitions, the state machine comprising:
- a logic circuit for generating, upon each transition of the state machine, output signals according to input signals the input signals comprising signals generated during a previous transition;
- a control signal generating circuit for generating at least one control signal during a transition of the state machine, according to a control signal generated during a previous transition; and
- a checking circuit for determining an expected value of the at least one control signal and comparing the at least one control signal with the expected value.

14. The state machine according to claim 13, wherein the control signal generating circuit generates two logic control signals that are the opposite of one another and inverted upon each transition of the state machine.

15. The state machine according to claim 14, in which the control signal generating circuit implements the following logic operations:

$$D1=N[C1].C2,$$

$$D2=C1.N[C2]$$

in which D1 and D2 are each a distinct one of the two logic control signals, C1 and C2 are the logic control signals obtained during a previous transition, N[x] represents a logic inversion operation applied to a signal x, and "." represents an AND logic operation.

16. The state machine according to claim 14, wherein the logic circuit comprises a programmable logic array comprising input inverters, product logic circuits, sum logic circuits, and configuration means for selectively connecting inputs of the state machine and outputs of the input inverters to the product logic circuits, and for selectively connecting outputs of the product logic circuits to inputs of the sum logic circuits, wherein the control signal generating circuit comprises for each of the two logic control signals a product logic circuit connected to a sum logic circuit supplying the logic control signal.

17. The state machine according to claim 16, wherein the product logic circuits and the sum logic circuits supplying the logic control signals are configured so that the generation of the logic control signals is slowed down.

18. The state machine according to claim 13, wherein the expected value of the at least one control signal is derived from a clock signal frequency.

19. A memory device comprising:
- a memory; and
- a state machine including
    - a control circuit configured to generate one or more secondary output control signals from the state machine based on one or more secondary input control signals previously generated by the control circuit; and
    - a checking circuit configured to generate and output an error signal from the state machine resulting from at least one of the one or more secondary output control signals of the state machine varying from an expected value, wherein the expected value is derived from a clock signal frequency.

20. The memory device according to claim 19, wherein the control circuit of the state machine is configured to generate two secondary output control signals having opposite values.

21. The memory device according to claim 19, wherein the checking circuit is configured to generate and output the error signal indicating an error in the operation of the state machine.

22. The memory device according to claim 19, wherein the state machine is configured to have an operation modeled by a set of states linked to each other by transitions, and wherein the control circuit is farther configured to generate the one or more secondary output control signals such that each of the one or more secondary output control signals change state upon each transition of the state machine and have different values.

* * * * *